United States Patent
Wang et al.

(10) Patent No.: US 11,652,132 B2
(45) Date of Patent: *May 16, 2023

(54) SYSTEMS AND METHODS FOR MANUFACTURING SEMICONDUCTOR MODULES

(71) Applicant: Ningbo Sunny Opotech Co., Ltd., Yuyao (CN)

(72) Inventors: Mingzhu Wang, Yuyao (CN); Nan Guo, Yuyao (CN); Jingfei He, Yuyao (CN); Zhenyu Chen, Yuyao (CN); Bojie Zhao, Yuyao (CN); Takehiko Tanaka, Yuyao (CN); Feifan Chen, Yuyao (CN); Ye Wu, Yuyao (CN); Zhen Huang, Yuyao (CN); Zhongyu Luan, Yuyao (CN)

(73) Assignee: Ningbo Sunny Opotech Co., Ltd., Yuyao (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/345,929

(22) Filed: Jun. 11, 2021

(65) Prior Publication Data
US 2021/0305308 A1      Sep. 30, 2021

Related U.S. Application Data

(63) Continuation of application No. 15/617,843, filed on Jun. 8, 2017, now Pat. No. 11,049,898.

(30) Foreign Application Priority Data

Apr. 1, 2017   (CN) .......................... 201710214811.5
Apr. 1, 2017   (CN) .......................... 201710214886.3
(Continued)

(51) Int. Cl.
*H05K 1/18*      (2006.01)
*H05K 3/28*      (2006.01)
(Continued)

(52) U.S. Cl.
CPC .. *H01L 27/14683* (2013.01); *H01L 27/14618* (2013.01); *H04N 23/55* (2023.01);
(Continued)

(58) Field of Classification Search
CPC ........................... H01L 27/146–14656; H01L 2225/06503–06596; G06T 2207/30148; H04N 5/335–378
(Continued)

(56) References Cited

U.S. PATENT DOCUMENTS 5,175,783 A   12/1992   Tatoh
5,937,279 A   8/1999   Sawada et al.
(Continued)

FOREIGN PATENT DOCUMENTS

CN   2725916      9/2005
CN   101075603    11/2007
(Continued)

OTHER PUBLICATIONS

Extended European Search Report for European Application No. 17882327.4 dated Jul. 20, 2020. 11 pages.
(Continued)

*Primary Examiner* — Xi Wang
(74) *Attorney, Agent, or Firm* — Sheppard Mullin Richter & Hampton LLP

(57) ABSTRACT

A method for manufacturing semiconductor modules for image-sensing devices is disclosed. The method may comprise applying a removable layer on a first surface of a printed circuit board (PCB) which comprises a plurality of PCB units; mounting a photosensitive member to a second
(Continued)

surface of each of the PCB units; and encapsulating the photosensitive member with an encapsulation layer on each PCB unit. Each PCB unit may comprise at least a semiconductor component on a second surface of the PCB and one or more opening across the first surface and the second surface. The photosensitive member and the removable layer separate the one or more opening from outside, and the photosensitive member is positioned to receive light through the opening. At least one semiconductor component is also encapsulated by the encapsulation layer on each PCB unit.

18 Claims, 15 Drawing Sheets

(30) Foreign Application Priority Data

| Apr. 1, 2017 | (CN) | 201710214887.8 |
|---|---|---|
| Apr. 1, 2017 | (CN) | 201720344605.1 |
| May 18, 2017 | (CN) | 201710353630.0 |
| May 18, 2017 | (CN) | 201710353700.2 |

(51) Int. Cl.

| H04N 23/55 | (2023.01) |
|---|---|
| H04N 23/57 | (2023.01) |
| H05K 3/00 | (2006.01) |
| H04N 5/225 | (2006.01) |
| H01L 27/146 | (2006.01) |
| H05K 1/02 | (2006.01) |

(52) U.S. Cl.
CPC ........... *H05K 1/0274* (2013.01); *H05K 1/181* (2013.01); *H05K 3/0052* (2013.01); *H05K 3/284* (2013.01); *H04N 23/57* (2023.01); *H05K 2201/10121* (2013.01); *H05K 2201/10151* (2013.01); *H05K 2203/1316* (2013.01)

(58) Field of Classification Search
USPC ............... 257/225–234, 257, 258, 291–294, 257/431–448; 382/145–151; 348/294–324
See application file for complete search history.

(56) References Cited

U.S. PATENT DOCUMENTS

| 6,036,908 | A | 3/2000 | Nishida et al. | |
|---|---|---|---|---|
| 6,414,384 | B1 | 7/2002 | Lo et al. | |
| 6,680,525 | B1 | 1/2004 | Hsieh et al. | |
| 6,795,120 | B2 | 9/2004 | Takagi et al. | |
| 6,835,596 | B2 | 12/2004 | Gotou et al. | |
| 6,893,169 | B1 | 5/2005 | Exposito et al. | |
| 7,176,055 | B2 | 2/2007 | Tsukahara et al. | |
| 7,296,345 | B1 | 11/2007 | Wang et al. | |
| 8,519,457 | B2 | 8/2013 | Sekine et al. | |
| 11,049,898 | B2 * | 6/2021 | Wang | H01L 27/14618 |
| 2003/0025825 | A1 | 2/2003 | Nakajoh | |
| 2004/0166763 | A1 | 8/2004 | Hanada et al. | |
| 2004/0251509 | A1 | 12/2004 | Choi | |
| 2005/0059188 | A1 * | 3/2005 | Bolken | H01L 24/97 438/106 |
| 2005/0116138 | A1 | 6/2005 | Hanada et al. | |
| 2005/0285016 | A1 | 12/2005 | Kong et al. | |
| 2006/0065964 | A1 | 3/2006 | Ohsumi | |
| 2006/0091487 | A1 | 5/2006 | Hanada et al. | |
| 2007/0010041 | A1 | 1/2007 | Kang et al. | |
| 2007/0029569 | A1 | 2/2007 | Andrews | |
| 2007/0183773 | A1 * | 8/2007 | Aoki | H04N 5/2254 396/529 |
| 2007/0236591 | A1 | 10/2007 | Tam et al. | |
| 2008/0265350 | A1 * | 10/2008 | Wu et al. | 257/432 |
| 2008/0273111 | A1 | 11/2008 | Gustavsson et al. | |
| 2008/0283952 | A1 | 11/2008 | Choi et al. | |
| 2009/0161006 | A1 | 6/2009 | Lee | |
| 2010/0200898 | A1 | 8/2010 | Lin et al. | |
| 2010/0253832 | A1 | 10/2010 | Duparre | |
| 2012/0112042 | A1 | 5/2012 | Webster | |
| 2012/0300142 | A1 * | 11/2012 | Kim | G02B 30/30 349/15 |
| 2013/0128106 | A1 * | 5/2013 | Tam | H04N 5/2253 348/374 |
| 2014/0272226 | A1 * | 9/2014 | Kim | B29C 48/2886 428/220 |
| 2014/0300805 | A1 | 10/2014 | Davis et al. | |
| 2015/0138436 | A1 | 5/2015 | Wong | |
| 2015/0334843 | A1 | 11/2015 | Jung et al. | |
| 2015/0350500 | A1 * | 12/2015 | Gutierrez | H05K 1/182 348/374 |
| 2016/0286169 | A1 | 9/2016 | Sannala | |
| 2016/0381260 | A1 | 12/2016 | Narayanswamy | |
| 2017/0244872 | A1 | 8/2017 | Wang et al. | |
| 2018/0138221 | A1 | 5/2018 | Wan et al. | |
| 2018/0170279 | A1 | 6/2018 | Achenbach et al. | |
| 2018/0226443 | A1 | 8/2018 | Yu et al. | |
| 2019/0319057 | A1 | 10/2019 | Wang et al. | |
| 2019/0326342 | A1 | 10/2019 | Wang et al. | |
| 2019/0364184 | A1 | 11/2019 | Wang et al. | |
| 2020/0382683 | A1 | 12/2020 | Wang et al. | |
| 2021/0167105 | A1 | 6/2021 | Wang et al. | |

FOREIGN PATENT DOCUMENTS

| CN | 101877944 | 11/2010 |
|---|---|---|
| CN | 102593116 | 7/2012 |
| CN | 202617250 | 12/2012 |
| CN | 105681637 | 6/2016 |
| CN | 105763780 | 7/2016 |
| CN | 106131386 | 11/2016 |
| JP | 2003219284 | 7/2003 |
| JP | 2006148473 | 6/2006 |
| JP | 2007306282 | 11/2007 |
| JP | 2009188828 | 8/2009 |
| JP | 2010050771 | 3/2010 |
| WO | WO-2018113794 | 6/2018 |
| WO | WO-2018113795 | 6/2018 |
| WO | WO-2018210337 | 11/2018 |

OTHER PUBLICATIONS

Extended European Search Report for European Application No. 18801348.6 dated Apr. 14, 2020. 7 pages.

Office Action for European Application No. 18801348.6 dated Mar. 9, 2021. 92 pages.

* cited by examiner

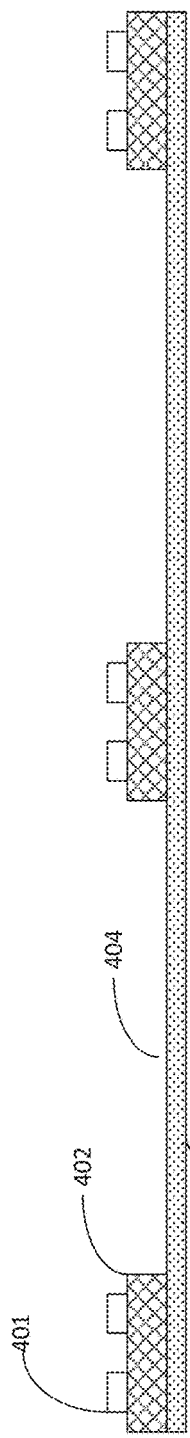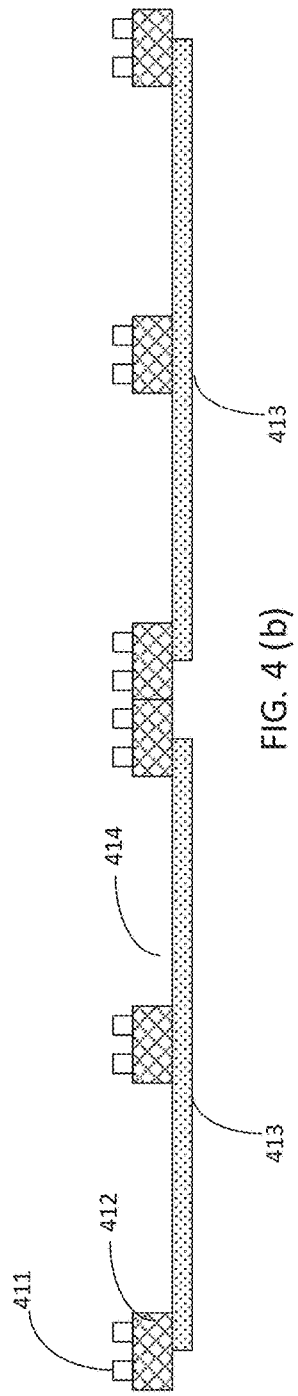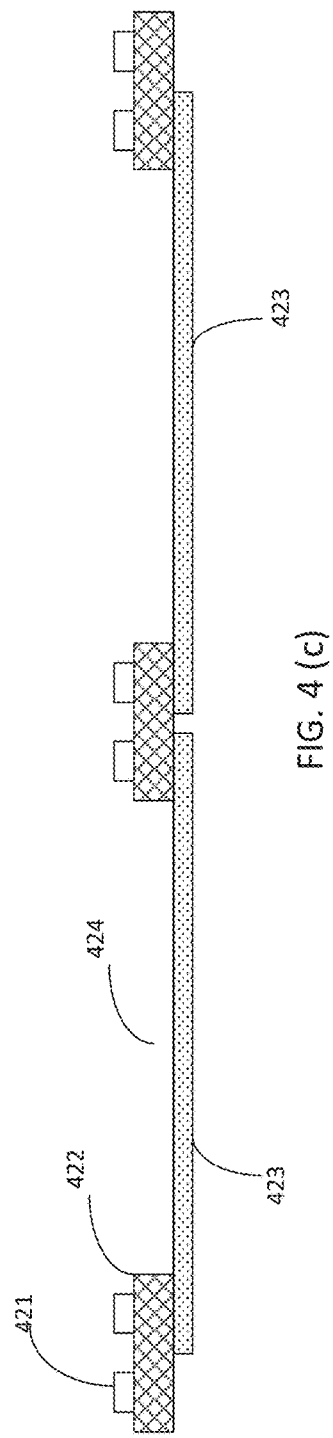

SYSTEMS AND METHODS FOR MANUFACTURING SEMICONDUCTOR MODULES

CROSS-REFERENCE TO RELATED APPLICATIONS

This application is a continuation of U.S. patent application Ser. No. 15/617,843, filed Jun. 8, 2017, which claims priority to and benefit of Chinese Patent Application Nos. 201710353630.0 and 201710353700.2, both filed May 18, 2017, and 201710214886.3, 201710214887.8, 201720344605.1 and 201710214811.5, all filed Apr. 1, 2017, the contents of all of which are incorporated by reference in their entireties into the present disclosure.

TECHNICAL FIELD

The disclosure relates generally to systems and methods for preparing semiconductor modules, particularly, semiconductor modules used in image-sensing devices such as cameras in portable devices.

BACKGROUND

Image-sensing devices are widely used in electronic devices. The image-sensing devices need to be configured to fit in the electronic devices, the design of which is often driven by consumer demands. For instance, for portable electronic devices, consumers prefer smaller sizes without willing to accept sacrifice on capabilities and qualities. In particular, in the field of portable electronic devices such a smartphone and tablets, thinner devices are in general more attractive than thicker ones.

Sometimes, the race to making thin devices causes the image-sensing device to protrude from the surface of an electronic device. This may not only affect the appearance of the electronic device, but also render the image-sensing device susceptible to physical damages such as scratches or even breakages. Therefore, reducing the dimensions of an image-sensing device is of great importance. However, due to physics of light, alteration of certain aspects of an image-sensing device is restricted. For instance, in order to achieve certain specification, the distance between an image sensor and the lens assembly may not be shortened.

An image-sensing device generally includes a circuit board, a photosensitive member, semiconductor components, an optical lens or lens assembly, and a holder that mounts the other components on the circuit board. In some designs, a filter is disposed between the lens and the photosensitive member.

SUMMARY

One aspect of this disclosure is directed to a method for manufacturing semiconductor modules for image-sensing devices. The method may comprise applying a removable layer on a first surface of a printed circuit board (PCB) which comprises a plurality of PCB units; mounting a photosensitive member to a second surface of each of the PCB units; and encapsulating the photosensitive member with an encapsulation layer on each PCB unit. Each PCB unit may comprise at least a semiconductor component on a second surface of the PCB and one or more openings across the first surface and the second surface. The photosensitive member and the removable layer separate the one or more openings from outside, and the photosensitive member is positioned to receive light through the opening. At least one semiconductor component is also encapsulated by the encapsulation layer on each PCB unit.

Another aspect of this disclosure is directed to a semiconductor module which can be used in an imaging-sensing device. The module may comprise a printed circuit board (PCB); a removable layer on a first surface of the PCB; a photosensitive member; and an encapsulation layer. The PCB may comprise at least a semiconductor component and one or more opening. At least one semiconductor component is positioned on a second surface of the PCB, one or more openings are across the first surface and the second surface, and are separated from outside by the photosensitive member and the removable layer. The photosensitive member is positioned on the second surface of the PCB, and is configured to receive light through the opening. The encapsulation layer is configured to encapsulate the photosensitive member and the at least one semiconductor component with the PCB.

Another aspect of this disclosure is directed to an imaging-sensing device. The device may comprise one or more lens; a printed circuit board (PCB); a transparent layer on a first surface of the PCB; a photosensitive member; and an encapsulation layer. The PCB may comprise at least a semiconductor component and one or more openings. at least one semiconductor component is positioned on the second surface of the PCB, one or more openings are across the first surface and the second surface, and are separated from outside by the photosensitive member and the transparent layer. The photosensitive member is positioned on the second surface of the PCB, and is configured to receive light through the opening. The encapsulation layer is configured to encapsulate the photosensitive member and the at least one semiconductor component with the PCB.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this disclosure, illustrate several non-limiting embodiments and, together with the description, serve to explain the disclosed principles.

FIG. 4(a) is a side view of one exemplary embodiment of the PCB with the removable layer; FIG. 4(b) is a side view of another exemplary embodiment of the PCB with the removable layer; FIG. 4(c) is a side view of another exemplary embodiment of the PCB with the removable layer; consistent with exemplary embodiments of the present disclosure.

DETAILED DESCRIPTION OF THE EMBODIMENTS

Figure 1:
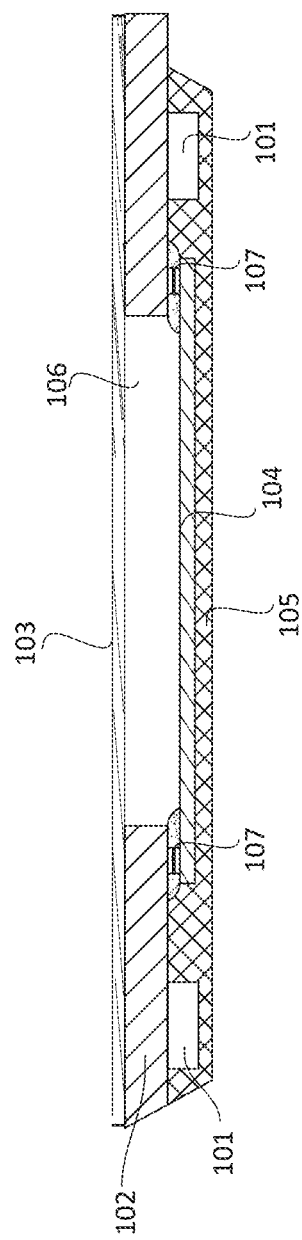
FIG. 1 is graphical representation illustrating a structure of a semiconductor module, consistent with exemplary embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention.

Introduction and Definitions

In some common designs of image-sensing devices, the photosensitive member (e.g., image-sensing wafer) is mounted on the circuit board and the semiconductor components are also mounted on the same side of the circuit board. In order to prevent electric shortages and to accommodate all the semiconductor components, the surface of the circuit board needs to be sufficiently large.

It has also been observed that when the semiconductor components and the photosensitive member are located in the same compartment, shedding particles of the semiconductor component due to contact or oxidation may cause contaminations to the photosensitive region of the photosensitive member, or adhere to the filter element, resulting in defective images.

Another observation is that, during the manufacturing process, the photosensitive member is exposed to the air and may collect dust particles, which would compromise the quality of the device. In order to prevent collection of dust, the manufacturing process may need to be carried in a clean room, adding significant costs to the process.

Certain embodiments of the present disclosure provide systems and methods for preparing image-sensing devices that are smaller in size and more durable than what are currently available on the market, avoiding the presence of dusts in the devices and reducing the cost of making such devices.

In some embodiments, a process of manufacturing a semiconductor module is provided. In one embodiment, the circuit board is provided that contains or can be prepared to contain semiconductor components required by the semiconductor module. The circuit board, e.g., a printed circuit board (PCB), can have a first surface that would face the lens assembly when assembled into an image-sensing device, hereinafter referred to as a "lens-facing surface." The circuit board can also include an opposite surface, hereinafter referred to as a "back surface."

In some embodiments, a semiconductor component is disposed on the back surface of the circuit board. In some embodiments, more than one semiconductor components are disposed on the back surface. In some embodiments, the circuit board contains one "set" of semiconductor components required for an image-sensing device. In some embodiments, the circuit board includes multiple sets, so that when the circuit board is eventually divided into individual units, each unit can be assembled into an image-sensing device. In this context, a portion of the circuit board that includes a requisite set of the semiconductor component is referred to as a "circuit board unit", or "printed circuit board unit" (PCB unit).

It is noted, however, that an image-sensing device may include more than one set of lens assembly-photosensitive member groups. For convenience of annotation, if a group of lens-photosensitive member is referred to as a camera, then such image-sensing device may be referred to as having a multi-camera array. In some embodiments, such an array includes two cameras. In some embodiments, such an array includes four cameras.

Also present, in each circuit board unit, is one or more openings. For a circuit board unit to be assembled into a single-camera device, there may be one opening. For a circuit board unit to be assembled into a multi-camera device, there may be more than one opening. Each opening, in some embodiments, is shaped so that when a photosensitive member is fixed on one side of the circuit board, light can travel through the opening from the other side of the circuit board to arrive at the photosensitive member. In some embodiments, the opening takes the shape of round, rectangular, triangle, hexangular, or oval, without limitation.

In some embodiments, in addition to the semiconductor components disposed on the back surface of the circuit board, one or more semiconductor components can also be disposed on the lens-facing surface. In some embodiments, there are no semiconductor component on the lens-facing surface. In some embodiments, there are fewer semiconductor components on the lens-facing surface than on the back surface of the circuit board.

In the manufacturing process, in some embodiments, a removable layer and a photosensitive member can, at any order, be disposed on the lens-facing and back surfaces of the circuit board, respectively. In one embodiment, the removable layer is disposed to the lens-facing surface of the circuit board first. In one embodiment, the photosensitive member is disposed to the back surface of the circuit board first. In one embodiment, both the removable layer and the photosensitive member are disposed to the surfaces of the circuit board at the same time.

A "photosensitive member" as used herein refers to a semiconductor material having a substantively smooth surface which is sensitive to light and can be configured to convert light to electric signals. The surface is commonly flat and the member typically comprises an electric circuit on a wafer which is made of semiconducting materials with methods readily known in the art.

A "removable layer" as used herein refers to any layer that can be applied to cover openings of a surface of a board and provide insulation to the openings from dust particle contamination, and then be removed when needed. The removable layer may have an adhesive surface which, however, is not necessary. For instance, the removable layer can also be fixed, temporarily, to the board by one or more clips or other physical restraints.

When each photosensitive member is installed, preferably the entire or the majority of the photosensitive area of the photosensitive side is exposed through an opening of the circuit board. In one embodiment, once the photosensitive member is disposed on the back surface of the circuit, the member seals the opening from the back surface to in a way to prevent dust or other small particles from entering the opening from the side of the back surface. In one embodiment, the photosensitive member itself does not seal the opening but a subsequent step will seal the opening.

In some embodiments, each opening is mounted and sealed with a photosensitive member. In some embodiments, the photosensitive member is not in direct contact with any of the semiconductor component. In some embodiments, more than one openings are mounted and sealed with a photosensitive member. In some embodiments, the semiconductor components and welding materials are insulated from the photosensitive member with a non-conductive material, which can be applied after the openings are sealed.

The removable layer is disposed on the opposite, lens-facing surface of the circuit board. As explained in further detail below, one of the functions of the removable layer is to seal the opening, in combination with the photosensitive member (or the photosensitive member together with an encapsulation layer), such that dust particles do not come into the opening and contaminate the photosensitive member before the removable layer is removed later. Therefore, many different materials, such as a heat resistant tape, and methods can be used to accomplish this goal, which are discussed later.

As introduced above, in some embodiments, an encapsulation layer can be used to encapsulate a photosensitive member to the circuit board. Preferably, the encapsulation layer also encapsulates and protects the semiconductor components on the circuit board. Also as described in further details later, various materials and methods can be used to implement the encapsulation function.

At this point, each opening of the circuit board is separated from the external environment by the removable layer and the photosensitive member. Such prepared circuit board can then be separated into individual units, which can be referred to as "semiconductor modules" and can be used to prepare image-sensing devices. Until the removable layer is removed later, therefore, the photosensitive surface of the photosensitive member, which is now located in the opening, is insulated from the external environment.

The manufacturing processes of the above embodiments have a few advantages over the conventional technology.

First, the presently disclosed processes lead to greatly reduced contamination to the photosensitive member or other parts of the device. In a conventional manufacturing process, the photosensitive surface of the photosensitive member may be directly exposed to the environment of the workshop. Such an exposure is necessarily associated with high likelihoods of damage and contamination. By contrast, in various embodiments of the present technology, an insulated space is formed that protects the photosensitive surface. Such a process, therefore, necessarily results in higher quality image-sensing devices and increase overall process yield.

Second, the semiconductor modules and devices made by various embodiments of the present technology are also smaller in size than what are made by the conventional methods. Rather than placing the photosensitive member on the lens-facing side of the board, in various embodiments of the present technology, the photosensitive member is placed below the board. Because the distance between the optic lens and the photosensitive surface, given a requisite specification, cannot be shorter than a minimum, positioning of the board between the lens and the photosensitive member does not result in extending the depth of the image-sensing device. Along the perpendicular dimension, because the semiconductor components are disposed on the back surface of the circuit board, they can be closer to the photosensitive member. In other words, the present technology can reduce the size of semiconductor module, as well as image-sensing devices that include the semiconductor module, along the perpendicular dimension. In some embodiments, the semiconductor components are distributed over both surfaces of the circuit board, further allowing the circuit board, hence the overall image-sensing device, to be smaller.

Third, the semiconductor modules and devices made by certain embodiments of the present disclosure can also be more durable than what are made by the conventional methods. In the conventional technology, module components may be fixed on the circuit board by soldering or resin. For such designs, external vibrations may loosen the components or even cause them to fall off. In some embodiments of the present technology, an encapsulation layer is employed to encapsulate various components in the board to ensure reliability and durability of the whole module or device.

Fourth, for an image-sensing device that includes two or more semiconductor modules (e.g., a dual-lens camera assembly, or a quadruple-lens camera assembly), no separate frame is required to hold and support the modules as what is typically done in the conventional technology. Instead, the encapsulation layer can provide adequate support and security to the semiconductor modules. In some embodiments, the semiconductor modules may be arranged in an array with each module having a lens assembly and associated photosensitive members and circuit boards. The encapsulation layer may secure the lens assemblies, photosensitive members and module components, and enhance the structure stability of the image-sensing device.

EXAMPLE EMBODIMENTS

FIG. 1 is a graphical representation illustrating an example semiconductor module of the present disclosure that can be used in an image-sensing device, consistent with exemplary embodiments of the present disclosure. The module may comprise a number of components, some of which may be optional. In some embodiments, the module may include many more components than those shown in FIG. 1. However, it is not necessary that all of these components be shown in order to disclose an illustrative embodiment.

As shown in FIG. 1, the module may include a printed circuit board (PCB) 102 (an example of a circuit board), one or more semiconductor component 101, a removable layer 103, an image-sensing wafer 104 (an example of a photosensitive member), an encapsulation layer 105, one or more openings 106, and one or more welding materials 107. The PCB 102 may have a first surface, a second surface and one or more openings 106. The opening 106 is across the first surface and the second surface, and is separated from outside by the wafer 104 and the removable layer 103. The removable layer 103 is located on the first surface of the PCB 102, and a semiconductor component 101 is located on the second surface of the PCB 102. The wafer 104 is also located on the second surface of the PCB 102, with its image-sensing surface facing towards and receiving light through the opening 106. The wafer 104 is configured to conduct with the PCB 102 by the welding materials 107. The encapsulation layer 105 is configured to encapsulate the wafer 104 and the semiconductor component 101 with the PCB 102, optionally with a sealing material.

Figure 2:
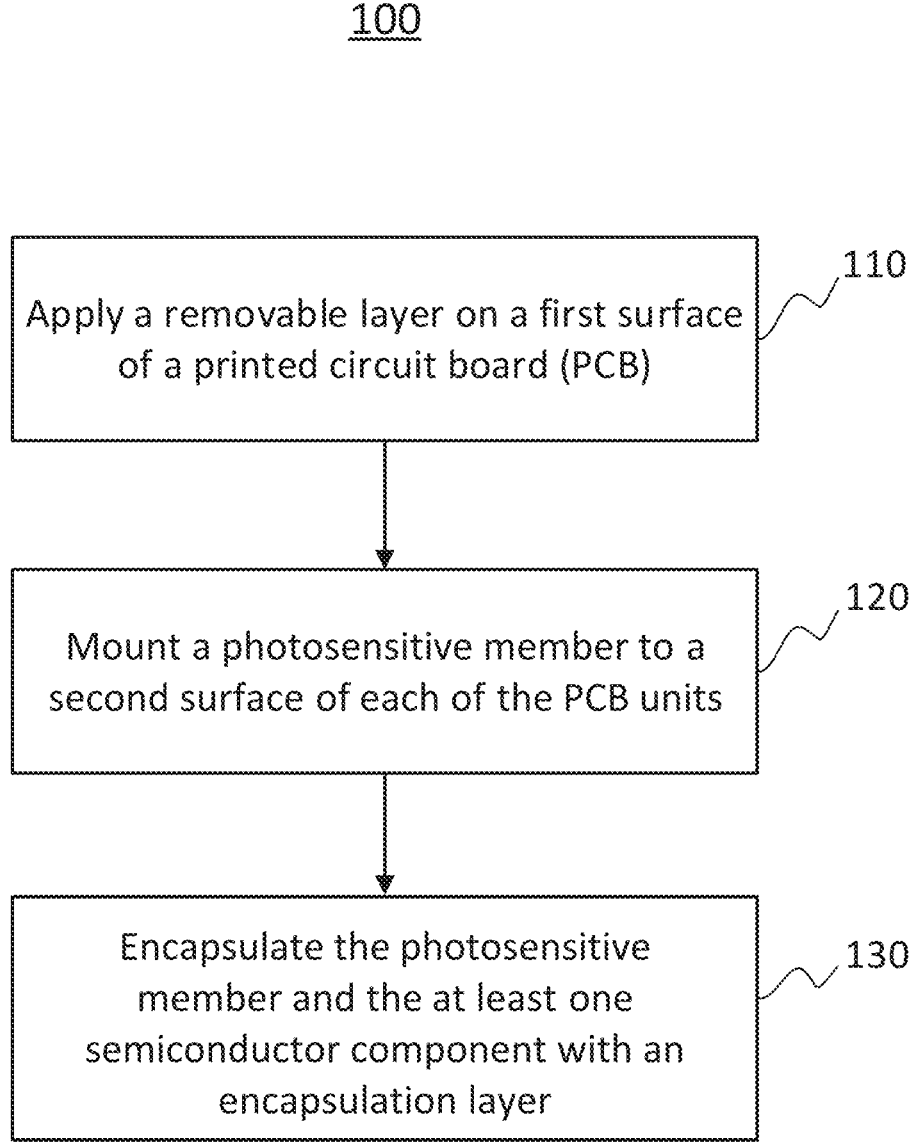
FIG. 2 is a flow diagram illustrating a method for manufacturing semiconductor modules for image-sensing devices; consistent with exemplary embodiments of the present disclosure.

FIG. 2 shows a flow diagram illustrating a method 100 for manufacturing semiconductor modules for image-sensing devices, in accordance with one exemplary embodiment of the present disclosure. The steps involved in the method 100 can also be graphically represented in FIGS. 3-6.

Figure 3B:
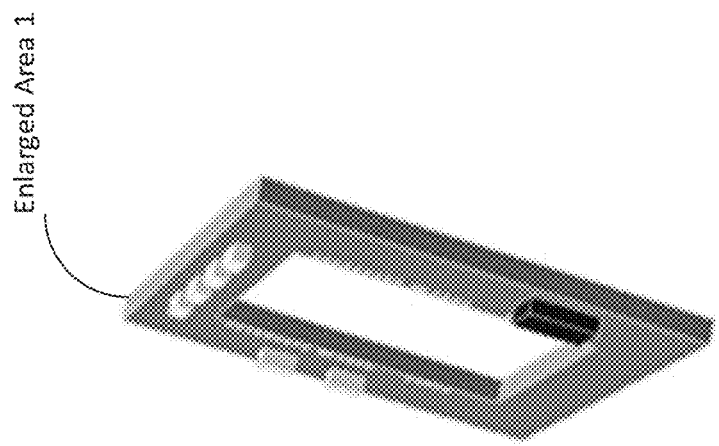
FIG. 3(b) is a graphical representation illustrating an enlarged area of the PCB; consistent with exemplary embodiments of the present disclosure.
Figure 3A:
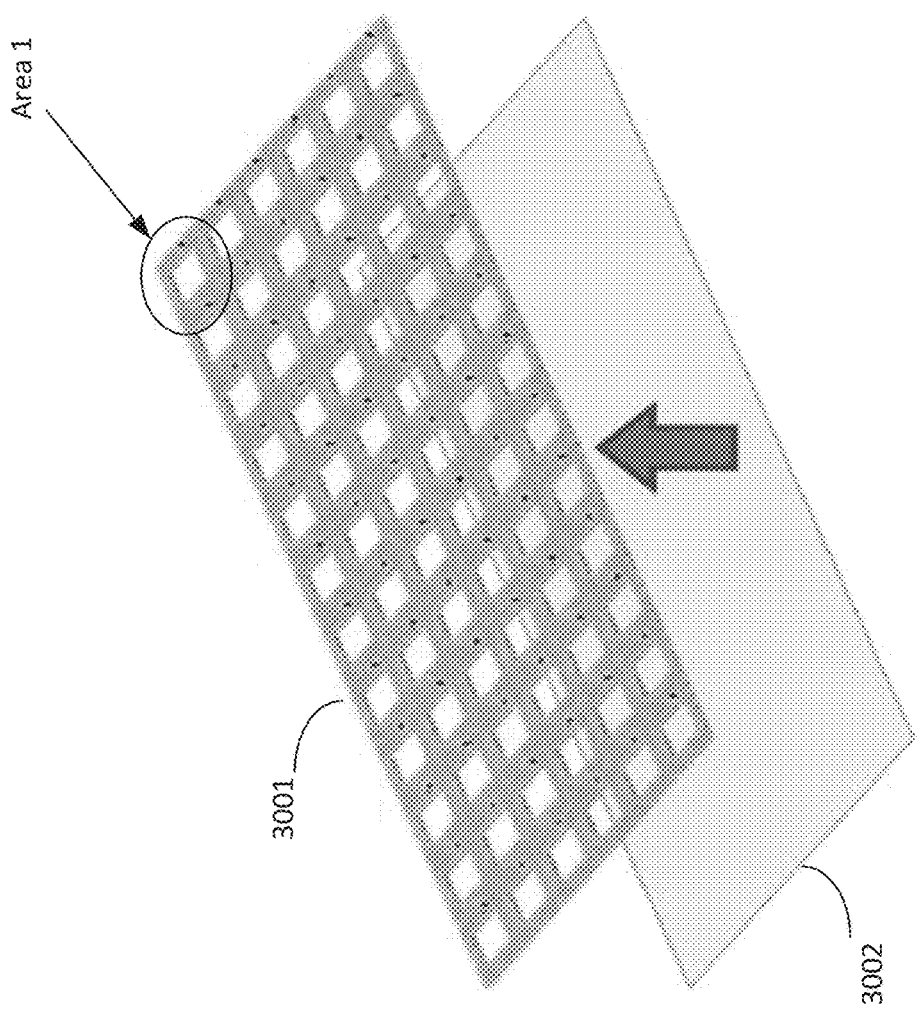
FIG. 3(a) is a graphical representation illustrating a process for applying a removable layer to a printed circuit board (PCB)

At step 110 in FIG. 2, a removable layer is applied on a first surface of a PCB. This process can be illustrated in a graphical representation in FIG. 3(a). As shown in FIG. 3(a), a removable layer 3002 is applied to a first surface of a PCB 3001. The PCB 3001 may include a plurality of PCB units, and each of the PCB units may include one or more semiconductor component and one or more opening. The semiconductor component is located on a second surface of the PCB, and the opening is across the first surface and the second surface. To have a clear view of the PCB unit, Area 1 is selected and enlarged in FIG. 3(b). As shown in FIG. 3(b), the PCB unit has one opening, and a plurality of semiconductor components on the second surface of the PCB unit. In some embodiments, the PCB unit may have more than one openings.

FIGS. 4(a)-(c) present different embodiments of a PCB applied with a removable layer, in accordance to the exemplary embodiments in this disclosure. In some embodiments, the removable layer may be a whole piece covering a plurality of PCB units. In some embodiments, the removable layer may comprise a plurality of removable layer pieces. In one embodiment, each removable layer piece may be applied on one PCB unit. In another embodiment, each removable layer piece may be applied to cover one opening of the PCB. As shown in FIG. 4(a), one removable layer 403 is applied on a first surface of two PCB units 402, and each PCB unit 402 has one opening 404. Semiconductor components 401 are positioned on a second surface of the two PCB units 402. FIG. 4(b) shows two removable layer pieces 413 applied on a first surface of two PCB units 412 respectively, and each PCB unit 412 has two openings 414. Semiconductor components 411 are positioned on a second surface of the two PCB units 412. FIG. 4(c) shows two removable layer pieces 423 applied on a first surface of two PCB units 422 respectively, and each PCB unit 422 has one opening 424. Semiconductor components 421 are positioned on a second surface of the two PCB units 422.

Figure 5A:
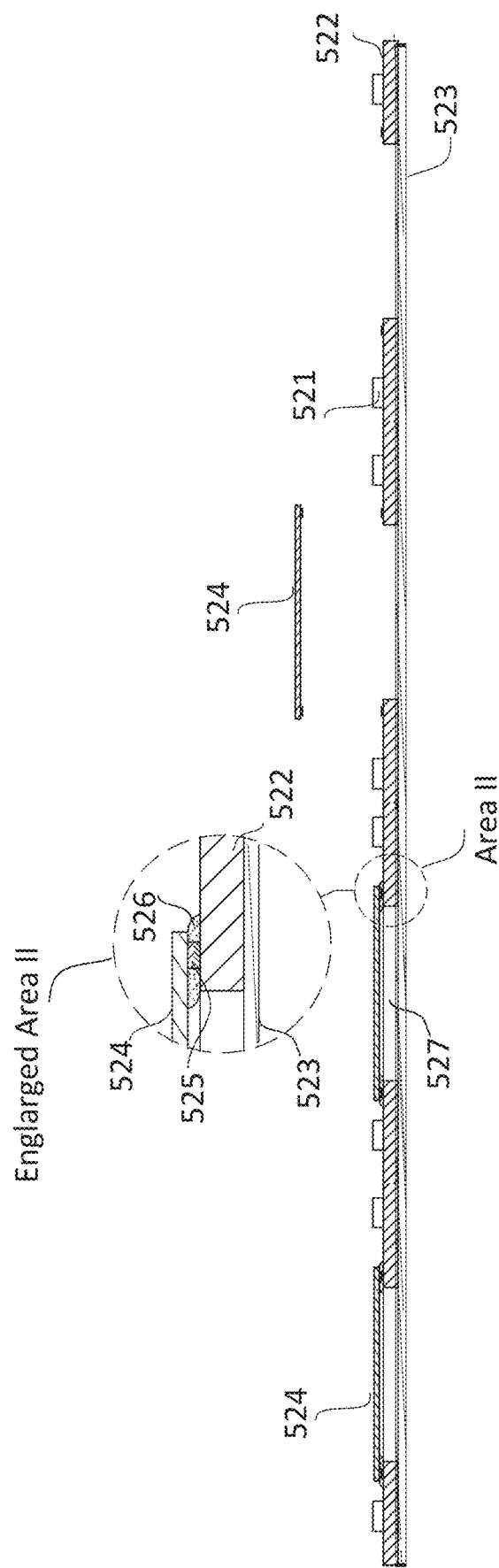
FIG. 5(a) is a graphical representation illustrating a process for mounting photosensitive members (e.g., image-sensing wafers)
Figure 5B:
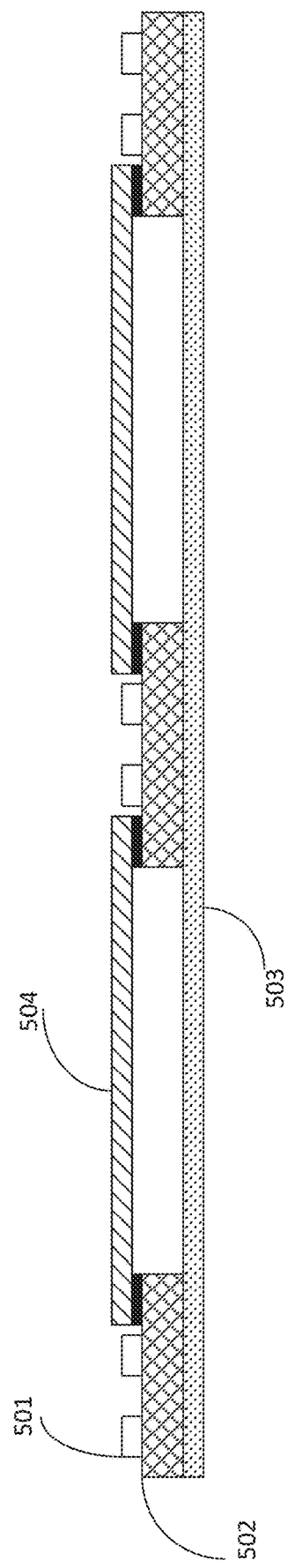
FIG. 5(b) is a side view of a PCB with photosensitive members; consistent with exemplary embodiments of the present disclosure.

At step 120 in FIG. 2, an image-sensing wafer is mounted on a second surface of each of the PCB units. This process can be illustrated in a graphical representation in FIG. 5(a). FIG. 5(a) shows a PCB 522 which includes a plurality of PCB units. A removable layer 523 is on a first surface of the PCB 522, and one or more semiconductor component 521 locates on a second surface of each of the PCB unit. An image-sensing wafer 524 is mounted to the second surface of each of the PCB unit. The image-sensing surface of the wafer 524 faces towards and receives light through the opening 527 of each of the PCB unit. In addition, the removable layer 523 and the wafer 524 separate the opening 527 from outside, and the removable layer 523 prevents the wafer 524 from contamination. To have a clear view of the wafer mounting, Area II is selected and enlarged. As shown in the enlarged Area II, the wafer 524 may be mounted to the PCB 522 by welding materials 525, and the welding gaps are insulated by glue sealing 526. FIG. 5(b) illustrates a side view of the PCB units with the wafers mounted. In FIG. 5(b), the PCB units have the semiconductor components 501, the PCB 502, the removable layer 503 and the wafers 504.

Figure 6A:
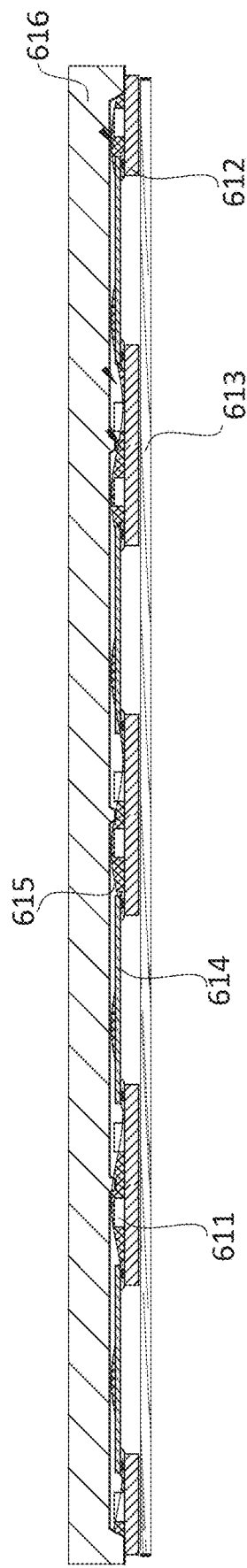
FIG. 6(a)-(b) are graphical representations illustrating a process of one embodiment, for encapsulating the semiconductor modules.
Figure 6B:
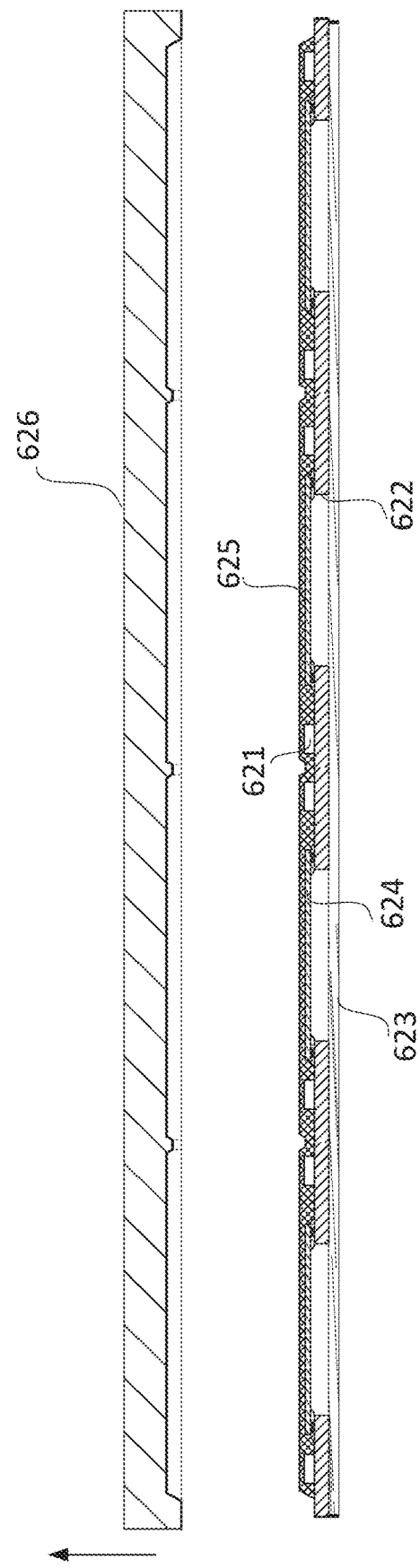
Figure 6C:
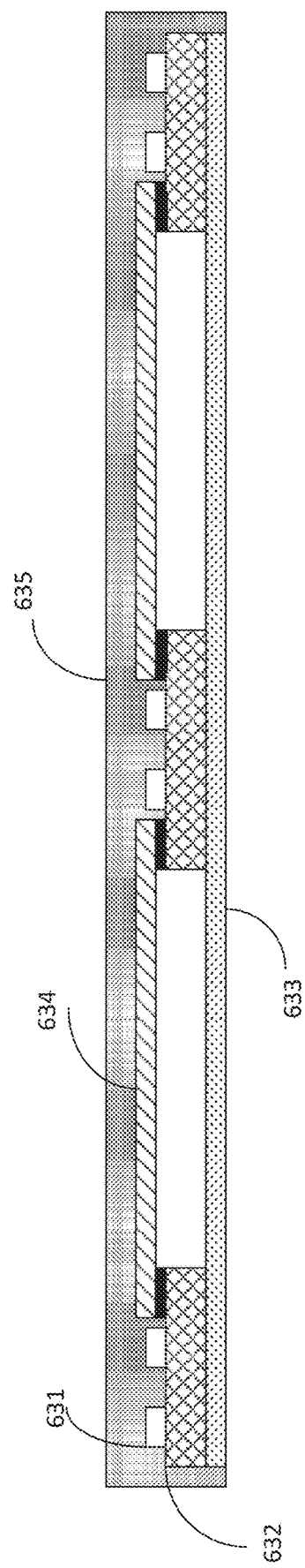
FIG. 6(c) is a side view of a PCB with an encapsulation layer prepared by a process of another embodiment.

At step 130 in FIG. 2, an encapsulation layer is applied on a second surface of the PCB to encapsulate the wafer and the semiconductor component on each of the PCB units. This process can be illustrated in graphical representations in FIGS. 6(a)-(b) in accordance with one exemplary embodiment of the present disclosure. As shown in FIG. 6(a), in some embodiments, a molding device 616 may be used at step 130. The molding device 616 is placed on the second surface of the PCB 612, forming a space among the molding device 616, semiconductor component 611, PCB 612 and wafer 614. An encapsulation material 615 is then filled in the space to form an encapsulation layer. In FIG. 6(b), the molding device 626 is removed, and an encapsulation layer 625 is formed. The wafer 624 and the semiconductor component 621 are encapsulated by the encapsulation layer 625 and the PCB 622. FIG. 6(c) also shows a side view of an example of the PCB units with an encapsulation layer, in accordance with one exemplary embodiment of the present disclosure. In FIG. 6(c), the PCB units have the semiconductor components 631, the PCB 632, the removable layer 633, the wafers 634 and the encapsulation layer 635.

In some embodiments, the encapsulation layer may also be formed by but not limited to blow molding, powder metallurgy and sintering, compression molding, extrusion molding, laminating, reaction injection molding, matrix molding, rotational molding, spin casting, transfer molding, thermoforming, vacuum forming, etc.

In some embodiments, the removable layer is a heat resistant adhesive. The heat resistant adhesive refers to a type of adhesive that remains stable at high temperatures.

In some embodiments, the removable layer may be a type of polymer. The polymer that can be used as the removable layer may include polypropylene, polyethylene terephthalate, polyvinyl chloride, polyimide, polytetrafluoroethylene, etc.

In some embodiments, the removable layer may be glass, a photoresist or a pressure sensitive adhesive (PSA). A photoresist is a light-sensitive material that forms a coating on a surface. A positive photoresist is a type of photoresist in which the portion of the photoresist that is exposed to light becomes soluble to the photoresist developer. A PSA is adhesive which forms a bond when pressure is applied to marry the adhesive with the adherent. No solvent, water, or heat is needed to activate the adhesive.

In some embodiments, the removable layer may comprise a plurality of removable layer pieces, and each piece is applied to each PCB unit separately, or each piece is applied to cover each opening of the PCB separately. Exemplary embodiments of the plurality of removable layer pieces are shown in FIGS. 4(b)-(c).

In some embodiments, the removable layer may be applied on the PCB by pressure, heat, chemical vapor deposition, clipping, plating or spaying. For example, a PSA can be pressed on the PCB as a removable layer without solvent, water, or heat to activate the adhesive. In another embodiment, a piece of glass can be clipped or glued onto the PCB as a removable layer.

In some embodiments, the removable layer can be removed from the PCB by peeling, for example, the removable layer comprises PSA. In some embodiments, the removable layer can be removed by dissolving in a solution. In some embodiments, the removable layer is a positive photoresist, and can be removed by exposing to light and dissolving by a photoresist developer.

In some embodiments, the encapsulation layer may comprise a polymer. For example, an epoxy molding compound (EMC) may be used as the encapsulation material. EMCs are widely used to encapsulate semiconductor devices due to their superior properties such as high mechanical strength and high productivity. In some embodiments, EMCs are solid epoxy polymers that are heated to a liquid and then injected into a molding device to form protection. An exemplary embodiment with EMC as the encapsulation material can be illustrated in FIGS. 6(a)-(b).

In some embodiments, the encapsulation layer may comprise polyvinyl butyral, a silicon, ceramics, or graphite.

In some embodiments, the encapsulation layer may be formed by a mix reaction, heating, or exposure to UV light.

Figure 7:
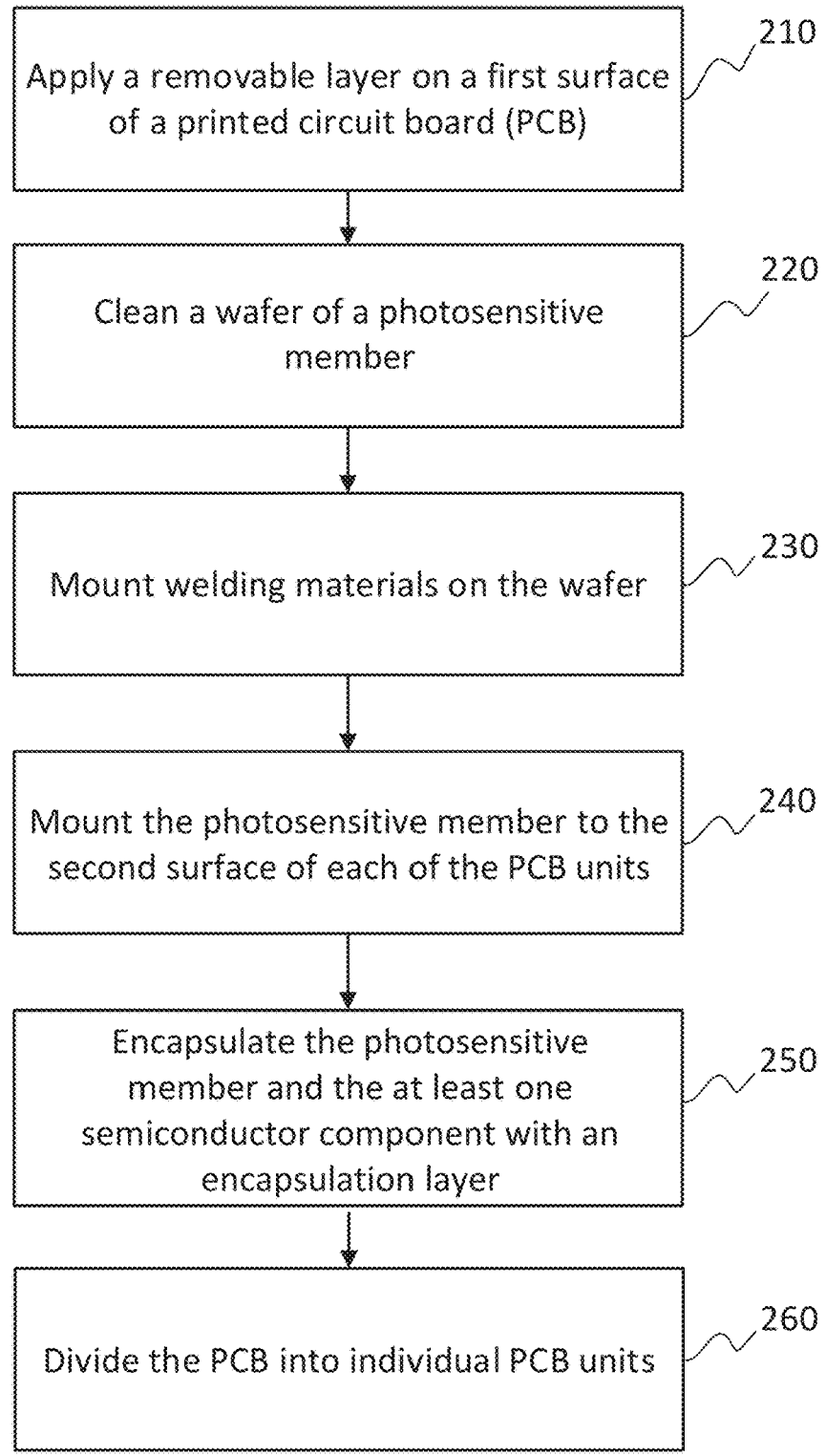
FIG. 7 is a flow diagram illustrating another method for manufacturing semiconductor modules for image-sensing devices, consistent with exemplary embodiments of the present disclosure.

FIG. 7 is a flow diagram illustrating a method 200 for manufacturing semiconductor modules for image-sensing devices, consistent with another exemplary embodiment of the present disclosure. In addition to the process discussed previously in method 100, the method 200 may further include steps 220, 230, and 260.

Figure 8A:
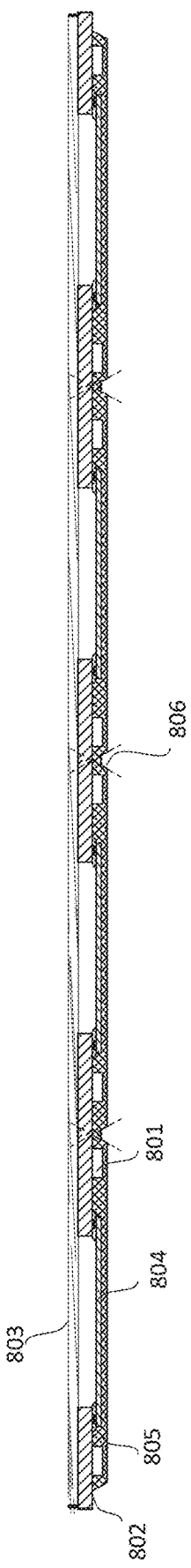
FIG. 8(a) is a side view of semiconductor modules with the removable layer facing upward.

Prior to mounting an image-sensing wafer to each of the PCB units, the wafer is cleaned at step 220 and mounted with welding materials at 230. The welding materials are used to conduct the wafer to the PCB units. The welding materials are graphically illustrated in as 525 in FIG. 5(a) in accordance with the exemplary embodiments of the present disclosure. At step 260, the PCB is divided into individual PCB units. As shown in FIG. 8(a), the PCB may include a plurality of PCB units. Each PCB unit may include at least one semiconductor component 801, a piece of PCB 802, a piece of removable layer 803, a wafer 804, and a piece of an encapsulation layer 805. In some embodiments, the PCB units are divided with a particular direction, so that the PCB unit may have an inclined edge 806, shown in FIG. 8(a). The inclined edge 806 may have an angle with a range of 0.1-10°. By dividing the PCB into individual PCB units, each PCB unit may be a semiconductor module that can be used in an image-sensing device. As discussed previously, one example of the semiconductor module is graphically illustrated in FIG. 1.

In some embodiments, a process of flipping the PCB is performed to have the image-sensing surface of the wafer changed from facing downward to upward. An exemplary embodiment with downward-facing wafers is shown in FIG. 5(b), and an exemplary embodiment with upward-facing wafers is shown in FIG. 8(a). With the image-sensing surface facing downward during the manufacturing process, the image-sensing surface is more likely to be protected from contamination.

In one embodiment, the PCB is flipped before the PCB is divided into individual PCB units. In another embodiment, the PCB is divided into individual PCB units, then each PCB unit is then flipped to have the image-sensing surface of the wafer changed from facing downward to upward.

In some embodiments, the removable layer is a heat resistant adhesive. The heat resistant adhesive refers to a type of adhesive that remains stable at high temperatures.

In some embodiments, the removable layer may be a type of polymer. The polymer that can be used as the removable layer may include polypropylene, polyethylene terephthalate, polyvinyl chloride, polyimide, polytetrafluoroethylene, etc.

In some embodiments, the removable layer may be glass, a photoresist or a pressure sensitive adhesive (PSA). A photoresist is a light-sensitive material that forms a coating on a surface. A positive photoresist is a type of photoresist in which the portion of the photoresist that is exposed to light becomes soluble to the photoresist developer. A PSA is adhesive which forms a bond when pressure is applied to marry the adhesive with the adherent. No solvent, water, or heat is needed to activate the adhesive.

In some embodiments, the removable layer may comprise a plurality of removable layer pieces, and each piece is applied to each PCB unit separately, or each piece is applied to cover each opening of the PCB separately. Exemplary embodiments of the plurality of removable layer pieces are shown in FIGS. 4(b)-(c).

In some embodiments, the removable layer may be applied on the PCB by pressure, heat, chemical vapor deposition, clipping, plating or spaying. For example, a PSA can be pressed on the PCB as a removable layer without solvent, water, or heat to activate the adhesive. In another embodiment, a piece of glass can be clipped or glued onto the PCB as a removable layer.

In some embodiments, the removable layer can be removed from the PCB by peeling, for example, the removable layer comprises PSA. In some embodiments, the removable layer can be removed by dissolving in a solution. In some embodiments, the removable layer is a positive photoresist, and can be removed by exposing to light and dissolving by a photoresist developer.

In some embodiments, the encapsulation layer may comprise a polymer. For example, an epoxy molding compound (EMC) may be used as the encapsulation material. EMCs are widely used to encapsulate semiconductor devices due to their superior properties such as high mechanical strength and high productivity. In some embodiments, EMCs are solid epoxy polymers that are heated to a liquid and then injected into a molding device to form protection. An exemplary embodiment with EMC as the encapsulation material can be illustrated in FIGS. 6(a)-(b).

In some embodiments, the encapsulation layer may comprise polyvinyl butyral, a silicon, ceramics, or graphite.

In some embodiments, the encapsulation layer may be formed by a mix reaction, heating, or exposure to UV light.

Figure 9:
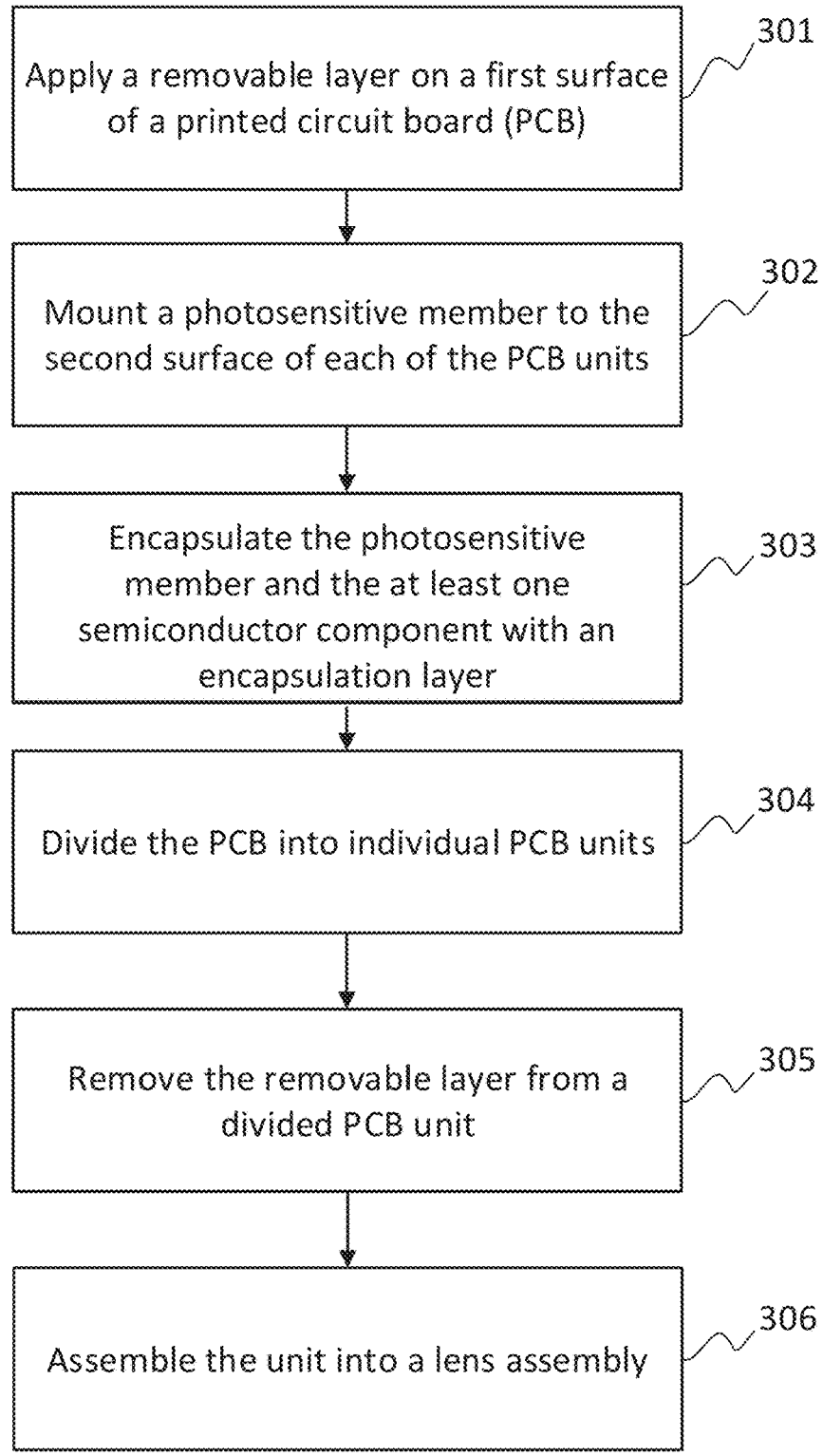
FIG. 9 is a flow diagram illustrating a method for manufacturing an image-sensing device, consistent with exemplary embodiments of the present disclosure.

FIG. 9 is a flow diagram illustrating a method 300 for manufacturing an image-sensing device, consistent with the exemplary embodiments of the present disclosure.

Similar to the previously discussed method 100, for the method 300, at step 301, a removable layer is applied on a first surface of PCB. At step 302, an image-sensing wafer is mounted on a second surface of each of the PCB units. At 303, an encapsulation layer is applied to a second surface of the PCB to encapsulate the wafer and the semiconductor component on each of the PCB units.

At step 304, in FIG. 9, the PCB is divided into individual PCB units. This process can be illustrated in a graphical representation in FIG. 8(a) in accordance with one exemplary embodiment of the present disclosure. As shown in FIG. 8(a), the PCB may include a plurality of PCB units. Each PCB unit may include at least one semiconductor component 801, a piece of PCB 802, a piece of removable layer 803, a wafer 804, and a piece of an encapsulation layer 805. In some embodiments, the PCB units are divided with a particular direction, so that the PCB unit may have an inclined edge 806, shown in FIG. 8(a). The inclined edge 806 may have an angle with a range of 0.1-10°. By dividing the PCB into individual PCB units, each PCB unit may be a semiconductor module that can be used in an image-sensing device. As discussed previously, one example of the semiconductor module is graphically illustrated in FIG. 1.

Figure 8B:
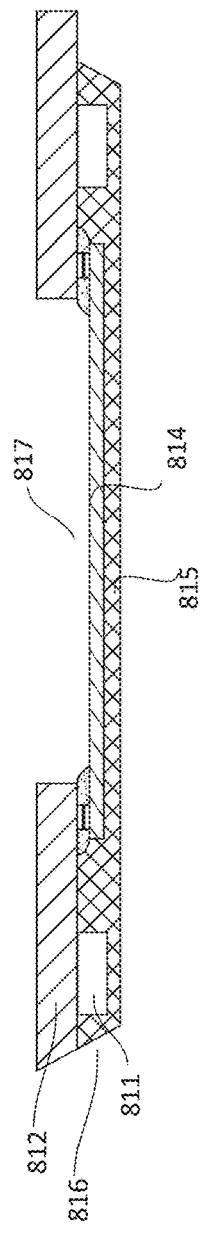
FIG. 8(b) is a side view of a semiconductor module with the removable layer removed; consistent with exemplary embodiments of the present disclosure.

At step 305, the removable layer can be removed. As shown in FIG. 8(b), a semiconductor module includes at least one semiconductor component 811, a PCB 812, an image-sensing wafer 814 and an encapsulation layer 815. The PCB 812 may have a first surface, a second surface, an inclined edge 816 and one or more opening 817. The opening 817 is across the first surface and the second surface, and is open for further process with the removable layer removed. The semiconductor component 811 is located on the second surface of the PCB 812. The wafer 814 is also located on the second surface of the PCB 812, with its image-sensing surface facing towards and receiving light through the opening 817. The encapsulation layer 815 is configured to encapsulate the wafer 814 and the semiconductor component 811 with the PCB 812.

Figure 10A:
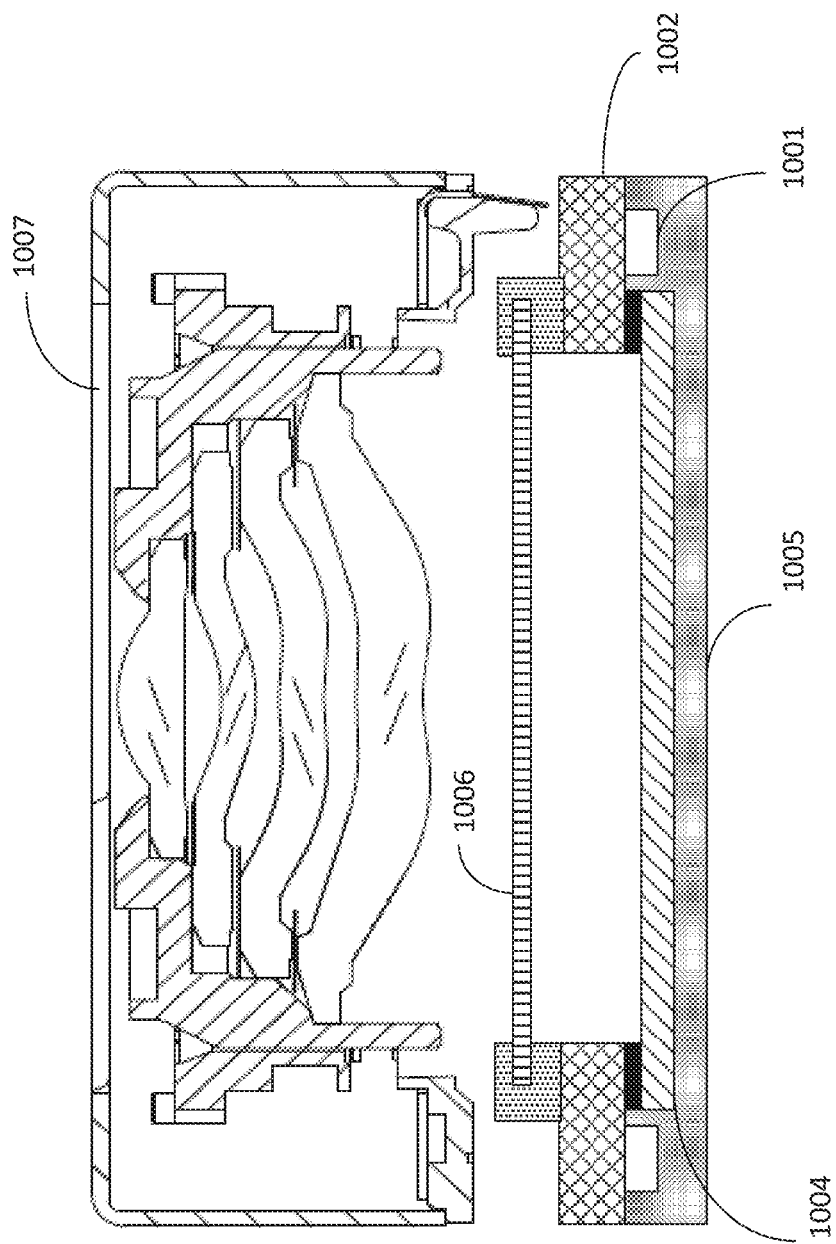
FIG. 10(a) is an exploded view of an image-sensing device.
Figure 10:
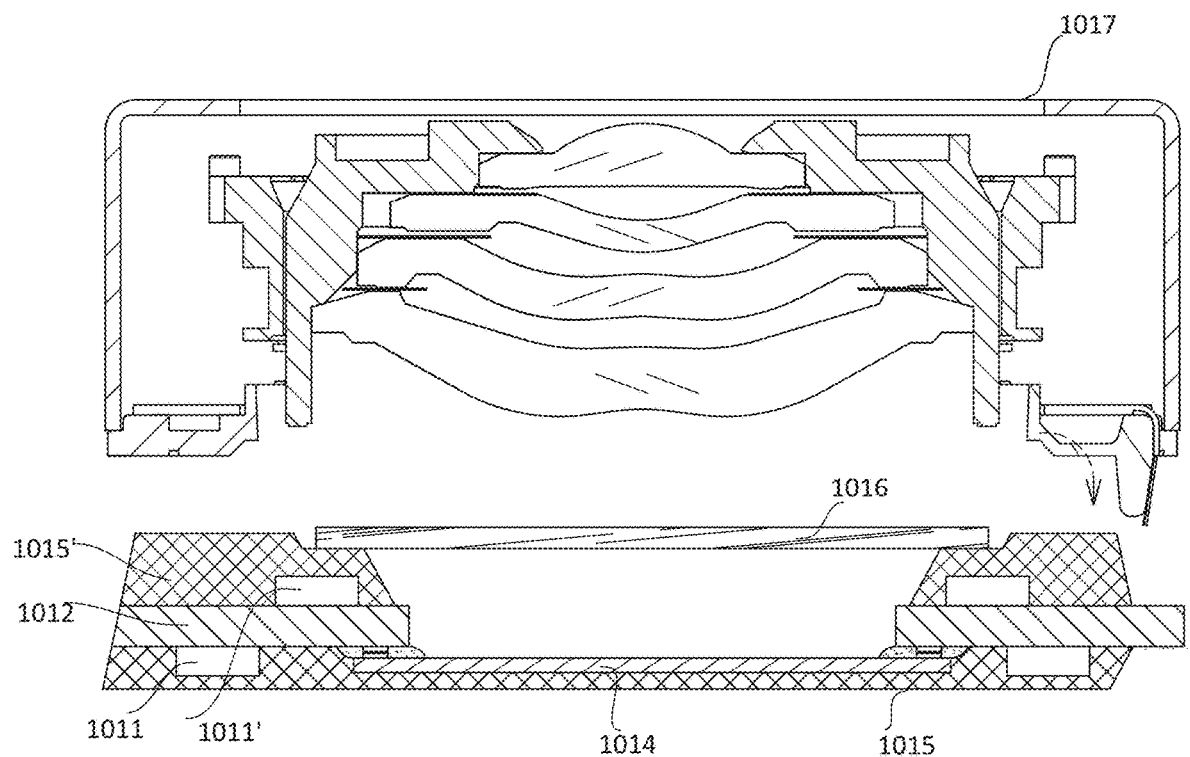
FIG. 10(b) is an exploded view of another image-sensing device; consistent with exemplary embodiments of the present disclosure.

At step 306, the PCB unit may be assembled with a lens assembly to form an image-sensing device. This process can be illustrated in a graphical representation in FIG. 10(a) in accordance with one exemplary embodiment of the present disclosure. As shown in FIG. 10(a), the PCB unit without a removable layer, may include at least a PCB 1002, at least one semiconductor component 1001, at least a wafer 1004 and an encapsulation layer 1005. The PCB unit is assembled to a lens assembly 1007 to form an image-sensing device. In some embodiments, an image-sensing device may also include a transparent layer 1006 as shown in FIG. 10(a). The transparent layer 1006 is mounted between the image-sensing wafer 1004 and the lens assembly 1007. It is positioned on the first layer of the PCB 1002, covering the opening of the PCB 1002 and leaving a space above the wafer 1004. In some embodiments, a frame or a molding is installed to support the transparent layer 1007.

In some embodiments, the removable layer is a heat resistant adhesive. The heat resistant adhesive refers to a type of adhesive that remains stable at high temperatures.

In some embodiments, the removable layer may be a type of polymer. The polymer that can be used as the removable layer may include polypropylene, polyethylene terephthalate, polyvinyl chloride, polyimide, polytetrafluoroethylene, etc.

In some embodiments, the removable layer may be glass, a photoresist or a pressure sensitive adhesive (PSA). A photoresist is a light-sensitive material that forms a coating on a surface. A positive photoresist is a type of photoresist in which the portion of the photoresist that is exposed to light becomes soluble to the photoresist developer. A PSA is adhesive which forms a bond when pressure is applied to marry the adhesive with the adherent. No solvent, water, or heat is needed to activate the adhesive.

In some embodiments, the removable layer may comprise a plurality of removable layer pieces, and each piece is applied to each PCB unit separately, or each piece is applied to cover each opening of the PCB separately. Exemplary embodiments of the plurality of removable layer pieces are shown in FIGS. 4(b)-(c).

In some embodiments, the removable layer may be applied on the PCB by pressure, heat, chemical vapor deposition, clipping, plating or spaying. For example, a PSA can be pressed on the PCB as a removable layer without solvent, water, or heat to activate the adhesive. In another embodiment, a piece of glass can be clipped or glued onto the PCB as a removable layer.

In some embodiments, the removable layer can be removed from the PCB by peeling, for example, the removable layer comprises PSA. In some embodiments, the removable layer can be removed by dissolving in a solution. In some embodiments, the removable layer is a positive photoresist, and can be removed by exposing to light and dissolving by a photoresist developer.

In some embodiments, the encapsulation layer may comprise a polymer. For example, an epoxy molding compound (EMC) may be used as the encapsulation material. EMCs are widely used to encapsulate semiconductor devices due to their superior properties such as high mechanical strength and high productivity. In some embodiments, EMCs are solid epoxy polymers that are heated to a liquid and then injected into a molding device to form protection. An exemplary embodiment with EMC as the encapsulation material can be illustrated in FIGS. 6(a)-(b).

In some embodiments, the encapsulation layer may comprise polyvinyl butyral, a silicon, ceramics, or graphite.

In some embodiments, the encapsulation layer may be formed by a mix reaction, heating, or exposure to UV light.

FIG. 10(a) presents an exemplary embodiment of an image-sensing device. The device may include one or more lens, at least a PCB 1002, at least one first semiconductor component 1001, at least an image-sensing wafer 1004, an encapsulation layer 1005 and at least a transparent layer 1006. The PCB 1002 may have a first surface, a second surface and one or more opening. The opening is across the first surface and the second surface, and is separated from outside by the wafer 1004 and the transparent layer 1006. The transparent layer 1006 is located on the first surface of the PCB 1002, and the first semiconductor component 1001 is located on the second surface of the PCB 1002. In some embodiments, a frame or a molding is installed to support the transparent layer 1007. The wafer 1004 is also located on the second surface of the PCB 1002, with its image-sensing surface facing towards and receiving light through the opening. The encapsulation layer 1005 is configured to encapsulate the wafer 1004 and the semiconductor component 1001 with the PCB 1002.

In some embodiments, as shown in FIG. 10(b), an image-sensing device may include one or more lens, at least a PCB 1012, at least one first semiconductor component 1011, an image-sensing wafer 1024, a first encapsulation layer 1015, a transparent layer 1016, at least one second semiconductor component 1011' and a second encapsulation layer 1015'. At least one second semiconductor component 1011' are positioned on the first surface of the PCB 1012. The second encapsulation layer 1015' may encapsulate the at least one second semiconductor component 1011' and prevents the second semiconductor component 1011' from contacting with the transparent layer 1016. In some embodiments, the first encapsulation layer 1015 and the second encapsulation layer 1015' may comprise same encapsulation material; in some embodiments, the first encapsulation layer 1015 and the second encapsulation layer 1015' may comprise different encapsulation materials.

In some embodiments, the transparent layer may include a plurality of transparent layer pieces, and each piece may be applied to each of the one or more opening separately. In some embodiments, the transparent layer may comprise a polymer or glass. In some embodiments, the transparent layer may be used as an optical filter.

In some embodiments, an image-sensing device may include a plurality of semiconductor modules which may be arranged to provide an array of modules each having a lens assembly and associated photosensitive members and PCBs. In some embodiment, the image-sensing device incudes two semiconductor modules, each semiconductor module having lens assembly of different optical properties. In some embodiment, the image-sensing device incudes four semiconductor modules, at least some of which semiconductor module having lens assembly of different optical properties.

Figure 11:
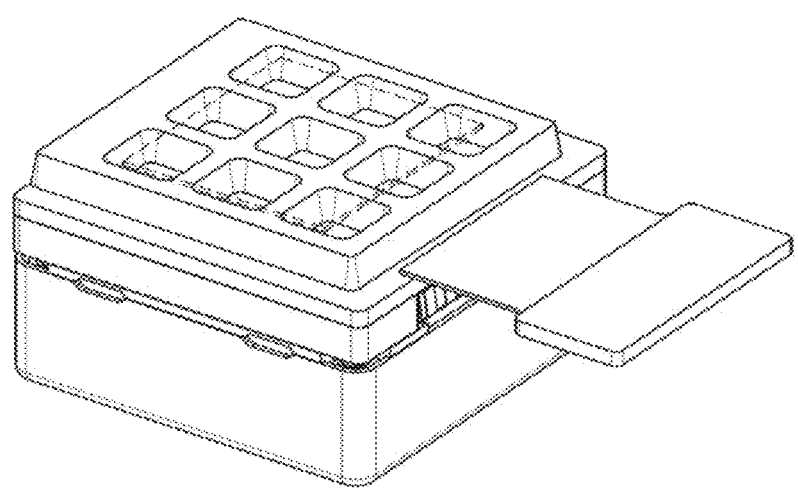
FIG. 11 is a graphical representation illustrating a semiconductor module having an encapsulation layer of a grid structure, consistent with exemplary embodiments of the present disclosure.

In some embodiments, the encapsulation layer may have different shapes or structures, for example, rectangular, circular, elliptical, or irregular shapes. FIG. 11 shows an encapsulation layer having a structure of a grid with multiple recesses. The holes may work as cooling windows. The grid structure may provide an even support to the PCB to increase assembly strength, and spaces for accommodating different assembly structures.

Figure 12:
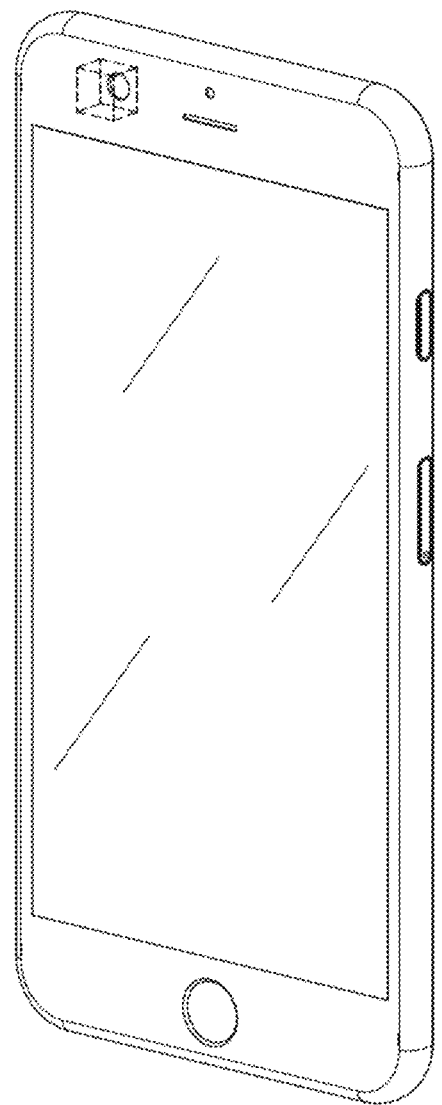
FIG. 12 is a graphical representation illustrating an exemplary application of an image-sensing device, consistent with exemplary embodiments of the present disclosure.

In some embodiments, the image-sensing device may be implemented in a mobile or stationary device which can take photos or videos. FIG. 12 shows an exemplary embodiment of an imaging-sensing device implemented in a mobile phone. In some embodiments, the image-sensing device may also be implemented as but not limited to a tablet computer, an electronic book, an MP3/4/5, a personal digital assistant, a camera, a television set, a washing machine, a car, a train, a plane etc.

In accordance with one embodiment of the present disclosure, therefore, provided is a method for manufacturing semiconductor modules for image-sensing devices, comprising:

applying a removable layer on a first surface of a printed circuit board (PCB) comprising a plurality of PCB units, wherein each PCB unit comprises at least a semiconductor component on a second surface of the PCB and one or more opening across the first surface and the second surface;

mounting an image-sensing wafer to the second surface of each of the PCB units wherein the wafer and the removable layer separate the one or more opening from outside, and the wafer is positioned to receive light through the opening;

encapsulating the wafer and the at least one semiconductor component with an encapsulation layer on each PCB unit; and dividing the PCB into individual PCB units.

In some embodiments, the method further comprises removing the removable layer from a divided PCB unit; and assembling the unit into a lens assembly. In some embodiments, the method further comprises, prior to mounting the wafer to each of the PCB units: cleaning the wafer; and mounting welding materials on the wafer.

In some embodiments, the removable layer is a heat resistant adhesive. In some embodiments, the removable layer comprises a polymer. In some embodiments, the polymer comprises polypropylene, polyethylene terephthalate, polyvinyl chloride, polyimide, or polytetrafluoroethylene.

In some embodiments, the removable layer comprises glass, a positive photoresist or a pressure sensitive adhesive. In some embodiments, the removable layer comprises a plurality of removable layer pieces, and each piece is applied to each PCB unit separately. In some embodiments, the removable layer is applied on the PCB by pressure, heat, chemical vapor deposition, clipping, plating, or spraying. In some embodiments, the removable layer is removed from the PCB unit by peeling, a solution, or exposing to light and dissolving in a photoresist developer.

In some embodiments, the encapsulation layer comprises a polymer. In some embodiments, the polymer comprises an epoxy molding compound. In some embodiments, the encapsulation layer comprises polyvinyl butyral, a silicon, ceramics, or graphite. In some embodiments, the encapsulation layer is formed by a mix reaction, heating, or exposure to UV light.

The present disclosure, in another embodiment, provides a semiconductor module, comprising:

a printed circuit board (PCB) which comprises at least a semiconductor component and one or more opening;

a removable layer on a first surface of the PCB;

an image-sensing wafer positioned on a second surface of the PCB to receive light through the opening; and an encapsulation layer configured to encapsulate the wafer and the at least one semiconductor component with the PCB, wherein the at least one semiconductor component is on the second surface of the PCB, the one or more opening is across the first surface and the second surface, and is separated from outside by the wafer and the removable layer.

In some embodiments, the removable layer is a heat resistant adhesive. In some embodiments, the removable layer comprises a polymer. In some embodiments, the polymer comprises polypropylene, polyethylene terephthalate, polyvinyl chloride, polyimide, or polytetrafluoroethylene.

In some embodiments, the removable layer comprises glass, a positive photoresist or a pressure sensitive adhesive. In some embodiments, the removable layer comprises a plurality of removable layer pieces, and each piece is applied to each of the one or more opening separately.

In some embodiments, the encapsulation layer comprises a polymer. In some embodiments, the polymer comprises an epoxy molding compound. In some embodiments, the encapsulation layer comprises polyvinyl butyral, a silicon, ceramics, or graphite.

Also provided, in one embodiment, is an image-sensing device, comprising:

one or more lens;

a printed circuit board (PCB) which comprises at least one first semiconductor component and one or more opening across a first surface and a second surface of the PCB;

an image-sensing wafer; and at least an encapsulation layer configured to encapsulate the wafer and at least one first semiconductor component with the PCB, wherein the wafer is positioned on the second surface of the PCB to receive light through the opening, the at least one first semiconductor component is on the second surface of the PCB.

In some embodiments, image-sensing device further comprises at least a transparent layer disposed between the lens and the photosensitive member, wherein the one or more opening is separated from the outside by the photosensitive member and the transparent layer. In some embodiments, the transparent layer comprises a plurality of transparent layer pieces, and each piece is applied to each of the one or more opening separately. In some embodiments, the transparent layer comprises a polymer or glass. In some embodiments, the transparent layer comprises an optical filter.

In some embodiments, the encapsulation layer comprises a polymer. In some embodiments, the polymer comprises an epoxy molding compound. In some embodiments, the encapsulation layer comprises polyvinyl butyral, a silicon, ceramics, or graphite.

In some embodiments, the device further comprises at least one second semiconductor component positioned on the first surface of the PCB.

In some embodiments, the device further comprises a support for the transparent layer. In some embodiments, the device further comprises welding materials that weld the photosensitive member to the PCB. In some embodiments, the device further comprises insulation glue that seals gaps between the welding materials and the photosensitive member. In some embodiments, the encapsulation layer has an inclined edge with an angle of 0.1-10°. In some embodiments, the encapsulation layer contacts with the photosensitive member, and has an inner contacting surface with an inclination of 10-80°. In some embodiments, the encapsulation layer contacts with the PCB, and has an outer contacting surface with an inclination of 5-45°.

In some embodiments, the device further comprises the image-sensing device is enclosed in an electric device that further comprises at least a processor and a storage.

The invention described and claimed herein is not to be limited in scope by the specific preferred embodiments disclosed herein, as these embodiments are intended as illustrations of several aspects of the invention. Indeed, various modifications of the invention in addition to those shown and described herein will become apparent to those skilled in the art from the foregoing description. Such modifications are also intended to fall within the scope of the appended claims.

What is claimed is:

1. A method for manufacturing semiconductor modules for image-sensing devices, comprising:
    applying a removable layer on a first surface of a printed circuit board (PCB) comprising a plurality of PCB units, wherein each PCB unit comprises at least a semiconductor component on a second surface of the PCB and one or more openings across the first surface and the second surface of the PCB;
    mounting at least a photosensitive member to the second surface of each of the PCB units via welding materials, wherein a first surface of the photosensitive member and the removable layer separate the one or more openings from an ambient environment, and the first surface of the photosensitive member is positioned to receive light through the one or more openings, wherein the one or more openings span a distance between a first PCB unit and a second PCB unit, a length of the photosensitive member exceeds a length of the one or more openings, and the photosensitive member extends from a first end of the first PCB unit to a second end of the second PCB unit;
    insulating gaps between the welding materials and the photosensitive member via a glue sealing to prevent dust from contacting the photosensitive member; and
    encapsulating the photosensitive member and at least one semiconductor component with an encapsulation layer on each PCB unit, wherein the encapsulating layer is in direct contact with a second surface of the photosensitive member and seals the second surface of the photosensitive member and the at least one semiconductor component from the ambient environment, and the second surface of the photosensitive member is opposite to the first surface of the photosensitive member.

2. The method of claim 1, further comprising removing the removable layer from a divided PCB unit.

3. The method of claim 1, further comprising assembling the unit into a lens assembly.

4. The method of claim 1, further comprising, prior to mounting the photosensitive member to each of the PCB units, cleaning the photosensitive member and mounting welding materials on the photosensitive member.

5. The method of claim 1, wherein the removable layer is a heat resistant adhesive or comprises a polymer.

6. The method of claim 5, wherein the polymer comprises polypropylene, polyethylene terephthalate, polyvinyl chloride, polyimide, or polytetrafluoroethylene.

7. The method of claim 1, wherein the removable layer comprises glass, a positive photoresist or a pressure sensitive adhesive.

8. The method of claim 1, wherein the removable layer is applied on the PCB by pressure, heat, chemical vapor deposition, clipping, plating, or spraying.

9. The method of claim 1, wherein the removable layer is removed from the PCB unit by peeling, grinding, a solution, or exposing to light and dissolving in a photoresist developer.

10. The method of claim 1, wherein the encapsulation layer comprises a polymer.

11. The method of claim 10, wherein the polymer comprises a molding compound.

12. The method of claim 1, wherein the encapsulation layer comprises polyvinyl butyral, a silicon, ceramics, or graphite.

13. The method of claim 1, wherein the encapsulation layer is formed by a mix reaction, heating, cooling, or exposure to UV light.

14. A semiconductor module, comprising:
    at least a printed circuit board (PCB) which comprises at least a semiconductor component and one or more openings;
    at least a removable layer on a first surface of the PCB;
    at least a photosensitive member positioned on a second surface of the PCB, wherein a first surface of the photosensitive member is configured to receive light through the one or more openings; and
    an encapsulation layer configured to encapsulate the photosensitive member and the at least one semiconductor component with the PCB, wherein:
        at least one semiconductor component is on the second surface of the PCB, the one or more openings are across the first surface and the second surface of the PCB, and are separated from an ambient environment by the photosensitive member and the removable layer,
        the photosensitive member is mounted to the second surface of the PCB by welding materials,
        gaps between the welding materials and the photosensitive member are insulated by a glue sealing to prevent dust from contacting the photosensitive member,
        the one or more openings span a distance between a first PCB unit and a second PCB unit, and the photosensitive member extends from a first end of the first PCB unit to a second end of the second PCB unit,
        the welding materials extend past the second end of the second PCB unit, a first end of the photosensitive member contacts the welding materials, and the glue sealing extends past the first end of the photosensitive member, and
        the encapsulating layer is in direct contact with a second surface of the photosensitive member and seals the second surface of the photosensitive member and the at least one semiconductor component from the ambient environment, and the second surface of the photosensitive member is opposite to the first surface of the photosensitive member.

15. The semiconductor module of claim 14, wherein the removable layer is a heat resistant adhesive.

16. The semiconductor module of claim 14, wherein the removable layer comprises glass, a positive photoresist or a pressure sensitive adhesive.

17. An image-sensing device, comprising:
one or more lens;
at least a printed circuit board (PCB) which comprises at least one semiconductor component and one or more openings across a first surface and a second surface of the PCB;
at least a photosensitive member; and
at least an encapsulation layer configured to encapsulate the photosensitive member and the at least one semiconductor component with the PCB, wherein:
the photosensitive member is positioned on the second surface of the PCB and attached via welding materials, gaps between the welding materials and the photosensitive member are insulated via a glue sealing to prevent dust from contacting the photosensitive member, a first surface of the photosensitive member is configured to receive light through the one or more openings, the at least one semiconductor component is on the second surface of the PCB,
the at least one semiconductor component comprises at least a first semiconductor component and a second semiconductor component, the one or more openings span a distance between the first semiconductor component and the second semiconductor component, a length of the photosensitive member exceeds a length of the one or more openings, and the photosensitive member extends from a first end of the first semiconductor component to a second end of the second semiconductor component, and
the encapsulating layer is in direct contact with a second surface of the photosensitive member and seals the second surface of the photosensitive member and the at least one semiconductor component from an ambient environment, and the second surface of the photosensitive member is opposite to the first surface of the photosensitive member.

18. The image-sensing device of claim 17, further comprising at least a transparent layer disposed between the lens and the photosensitive member, wherein the one or more openings are separated from the ambient environment by the photosensitive member and the transparent layer.

* * * * *